United States Patent [19]

Takasaki

[11] Patent Number: 4,945,503
[45] Date of Patent: Jul. 31, 1990

[54] HARDWARE SIMULATOR CAPABLE OF REDUCING AN AMOUNT OF INFORMATION

[75] Inventor: Shigeru Takasaki, Tokyo, Japan

[73] Assignee: NEC Corporation, Tokyo, Japan

[21] Appl. No.: 110,982

[22] Filed: Oct. 21, 1987

[30] Foreign Application Priority Data

| Oct. 21, 1986 | [JP] | Japan | 61-250557 |
| Nov. 11, 1986 | [JP] | Japan | 61-266656 |
| Mar. 20, 1987 | [JP] | Japan | 62-66170 |

[51] Int. Cl.$^5$ .......................... G06F 15/20; G06F 7/38
[52] U.S. Cl. .................................. 364/578; 364/490; 364/491; 371/23
[58] Field of Search ............... 364/578, 488, 489, 490; 371/23; 324/73 R

[56] References Cited

U.S. PATENT DOCUMENTS

| 4,342,093 | 7/1982 | Miyoshi | 364/578 |
| 4,527,249 | 7/1985 | Van Brunt | 364/578 |
| 4,541,071 | 9/1985 | Ohmori | 364/900 |
| 4,587,625 | 5/1986 | Marino, Jr. et al. | 364/578 |
| 4,694,411 | 9/1987 | Burrows | 364/578 |
| 4,697,241 | 9/1987 | Lavi | 364/488 |
| 4,713,606 | 12/1987 | Laviron | 324/73 R |
| 4,725,970 | 2/1988 | Burrows et al. | 364/578 |
| 4,744,084 | 5/1988 | Beck et al. | 371/23 |
| 4,747,102 | 5/1988 | Funatsu | 371/23 |
| 4,775,950 | 10/1988 | Terada et al. | 364/578 |
| 4,782,440 | 11/1988 | Nomizu et al. | 364/578 |
| 4,791,578 | 12/1988 | Fazio et al. | 371/23 |

Primary Examiner—Parshotam S. Lall
Assistant Examiner—Christopher L. Makay
Attorney, Agent, or Firm—Foley & Lardner, Schwartz, Jeffery, Schwaab, Mack, Blumenthal & Evans

[57] ABSTRACT

In a hardware simulator for use in successively carrying out simulations of gates arranged in a logic circuit, a plurality of connection data signals are stored in a connection memory to specify connections among the gates while a plurality of gate species data signals are stored in a gate species memory to represent each species of the gates. Responsive to a test data signal, a processing circuit executes each simulation of the gates with references to both the connection and the gate species data signals read out of the connection memory and the gate species memory, and supplies a simulation result signal to one of several status memories. Each simulation may be carried out in a pipeline fashion. Alternatively, the connection data signals can be derived from a modified logic circuit obtained by rearranging the logic circuit.

8 Claims, 9 Drawing Sheets

FIG. 3 — Table 31:

| | (L2-9) | (L2-5) | (L2-1) | |
|---|---|---|---|---|
| | 0 0<br>1 0<br>0 0<br>0 0 | 0 1 0<br>0 1 0<br>0 0 0<br>1 0 1 | 1 0 1<br>0 0 0<br>0 0 1<br>0 0 0 | D1 |
| | (L2-10) | (L2-6) | (L2-2) | |
| | 0 0<br>0 0<br>1 0<br>0 0 | 0 0 0<br>0 0 0<br>0 1 0<br>0 1 0 | 1 0 0<br>0 0 1<br>0 0 0<br>0 0 0 | D2 |
| | | (L2-7) | (L2-3) | |
| | 0 0<br>0 0<br>0 0<br>0 0 | 0 0 0<br>0 0 0<br>0 0 0<br>0 1 0 | 1 0 0<br>0 0 0<br>0 0 1<br>0 0 0 | D3 |
| | | (L2-8) | (L2-4) | |
| | 0 0<br>0 0<br>0 0<br>0 0 | 0 0 0<br>0 0 0<br>0 0 0<br>0 1 0 | 1 0 0<br>0 0 0<br>0 0 0<br>0 0 0 | D4 |
| INPUT END --- | 1 0 | 1 0 0 | 1 0 0 | C1 |

FIG. 4 — Table 32:

| | (L2-9) | (L2-5) | (L2-1) | |
|---|---|---|---|---|
| GATE SPECIES { | 0<br>0 | 0<br>0 | 0<br>0 | Z1 |
| POLARITY ------ | 0 | 0 | 0 | |
| | (L2-10) | (L2-6) | (L2-2) | |
| | 0<br>0<br>0 | 0<br>0<br>1 | 0<br>1<br>0 | Z2 |
| | | (L2-7) | (L2-3) | |
| | 0<br>0<br>0 | 0<br>0<br>0 | 0<br>1<br>1 | Z3 |
| | | (L2-8) | (L2-4) | |
| | 0<br>0<br>0 | 0<br>0<br>0 | 0<br>0<br>0 | Z4 |
| | 0<br>1 | 1<br>0 | 0 SKIP<br>0 LEVEL END | C2 |
| SIMULATION END --- | 0 | 0 | 0 | |

FIG.6 (31):

| | L2-9 | L2-5 | L2-1 | |
|---|---|---|---|---|
| D1 | 0 0 1 0 | 0 1 / 0 1 / 0 1 / 0 0 | 1 1 1 0 | D1 |
| D2 | 0 0 0 1 | 1 0 / 1 0 / 0 0 / 0 0 | 0 0 1 1 | D2 |
| D3 | 0 0 0 0 | 0 0 / 1 0 / 0 0 / 0 0 | 0 1 1 0 | D3 |
| D4 | 0 0 0 0 | 0 0 / 1 0 / 0 0 / 0 0 | 0 0 1 0 | D4 |
| C1 | 1 | 1 0 | 1 | C1 |

FIG.7 (32):

| | L2-9 | L2-5 | L2-1 | |
|---|---|---|---|---|
| Z1 | 0 0 0 | 0 0 0 | 0 0 0 | Z1 |
| Z2 | 0 0 0 | 0 0 1 | 0 1 0 | Z2 |
| Z3 | 0 0 0 | 0 0 0 | 0 1 1 | Z3 |
| Z4 | 0 0 0 | 0 0 1 | 0 0 0 | Z4 |
| C2 | 0 0 0 | 1 0 0 | 1 0 0 | C2 |

HARDWARE SIMULATOR CAPABLE OF REDUCING AN AMOUNT OF INFORMATION

BACKGROUND OF THE INVENTION

This invention relates to a hardware simulator for use in successively simulating logic operations of a plurality of gates included in a logic circuit.

Simulation of logic operations is effective in designing an assembly of gates for which logic operations are not yet decided and in assuring logic operations of a gate circuit which is already designed. As a rule, conventional simulation is carried out by the use of software and may be called software simulation.

An execution time of such software simulation tends to become long with an increase in an amount of test data signals necessary for the software simulation or with an increase in simulation clock signals. This results in software simulation for diagnosing a fault in a very big computer, such as a super computer being substantially impossible.

On the other hand, a hardware simulator is proposed as a dynamic gate array by Kenji Ohmori in the U.S. Pat. No. 4,541,071 assigned to the instant assignee. The hardware simulator is for use in simulating an overall operation carried out by a gate assembly comprising a plurality of gates. With this hardware simulator, each logic operation of the gates is simulated in consideration of those logic states of each gate which are determined by permutations. A great deal of logic states must be taken into account and stored in a permutation memory to be subjected to calculation. In addition, a gate memory must be included so as to the store results of calculation.

Memory capacities of the permutation memory and the gate memory must be exponentially increased with an increase of the logic states. This makes simulation of a large scale integrated circuit difficult.

SUMMARY OF THE INVENTION

It is an object of this invention to provide a hardware simulator which is capable of simulating an overall operation of a large scale integrated circuit comprising a great number of gates.

It is another object of this invention to provide a hardware simulator wherein simulations of logic operations can be successively carried out at a high speed.

It is a further object of this invention to provide a hardware simulator which is capable of reducing an amount of information necessary for the simulations.

According to this invention, a hardware simulator for use in successively carrying out simulations of a plurality of gates included in a logic circuit comprises connection memory means for storing a plurality of connection data signals which specify connections of said gates to produce a predetermined number of connection data signals one at a time, gate species memory means for storing a plurality of gate species data signals representative of species of the respective gates to produce the predetermined number of gate species data signals one at a time, data storing means for storing a plurality of test data signals necessary for simulation of the gates to successively produce each of said test data signals, simulation execution means coupled to the connection memory means, the gate species memory means, and the data storing means and responsive to an execution result signal for executing the simulations of the gates in response to the predetermined number of the connection data signals, the predetermined number of the gate species data signals, and each test data signal with reference to the execution result signal to successively produce a simulation result signal representative of a result of each of the simulations, holding means for holding the simulation result signal, and supply means for successively supplying the simulation result signal held in the holding means to the simulation execution means as the execution result signal.

BRIEF DESCRIPTION OF THE DRAWINGS

FIG. 3 is a diagram for use in describing contents of a connection memory used in the hardware simulator illustrated in FIG. 2;

FIG. 4 is a diagram for use in describing contents of a gate species memory used in the hardware simulator illustrated in FIG. 2;

FIG. 6 is a diagram for use in describing contents of a connection memory which are derived from the modified logic circuit illustrated in FIG. 5;

FIG. 7 is a diagram for use in describing contents of a gate species memory which are derived from the modified logic circuit;

Figure 1:
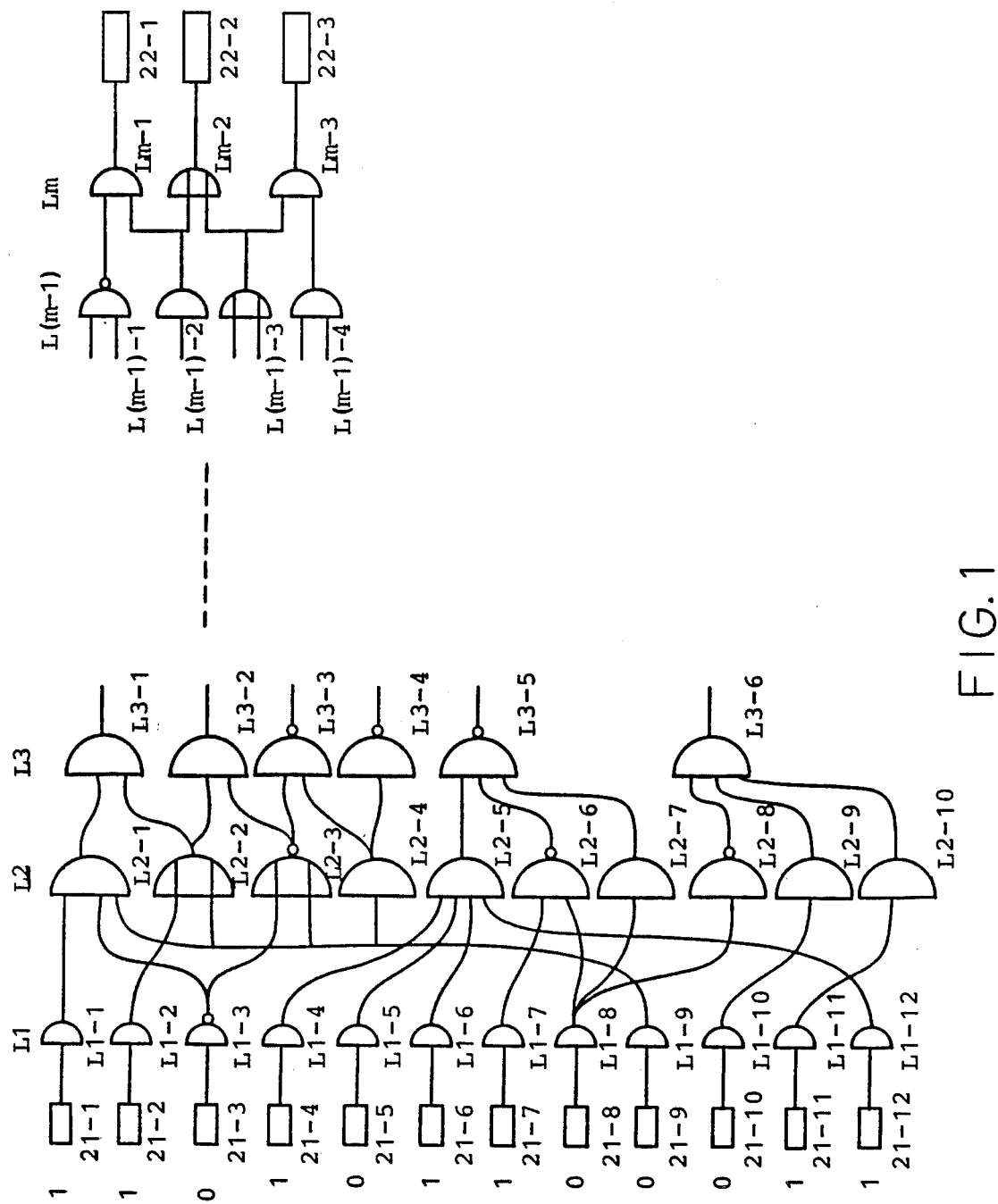
FIG. 1 exemplifies a circuit diagram which can be simulated by a hardware simulator according to this invention.

DESCRIPTION OF THE PREFERRED EMBODIMENTS:

Referring to FIG. 1, a logic circuit is exemplified which can be simulated by the use of a hardware simulator according to this invention and which comprises a plurality of gates between first through twelfth input terminals 21-1 to 21-12 and first through third output terminals 22-1 to 22-3. If there are flip flops (not shown) in the logic circuit, they are located at the respective output terminals. Each gate may be an AND gate, an OR gate, an EXOR gate, a NAND gate, a NOR gate, or an EXNOR gate. Herein, it should be noted that the NAND gate, the NOR gate, and the EXNOR gates can be specified by the AND gate, the OR gate, and the EXOR gate by negating output signals of the AND gate, the OR gate, and the EXOR gate, respectively. Each gate can be expressed by indicating a polarity and a species (namely, an attribute) which may represent either one of the AND gate, the OR gate, and the EXOR gate. Herein, it may be said that each output of the AND, OR, and EXOR gates is defined as a true output while each output of the NAND, NOR, and EXNOR gates is defined as a complement output.

The illustrated gates are divided into first through m-th levels which are depicted from L1 to Lm, respectively. The first level is composed of first through twelfth gates L1-1 to L1-12 while the second level is composed of first through tenth gates L2-1 to L2-10. The third level is composed of first through sixth gates L3-1 to L3-6 while the (m-1)-th level L(m-1) and the m-th level Lm are composed of first through third gates L(m-1)-1 to L(M-1)-3 and Lm-1 to Lm-3, respectively.

In order to facilitate an understanding of this invention, description will be directed to connections between the first and the second levels. The first gate L2-1 of the second level L2 is connected to the first, third, and ninth gates L1-1, L1-3, and L1-9 of the first level L1 while the second gate L2-2 of the second level L2 is connected to the second and the ninth gates L1-2 and L1-9 of the first level L1. The third gate L2-3 of the second level L2 is connected to the third and the ninth gates L1-3 and L-19 of the first level L1 while the fourth gate L2-2 of the second level L2 is connected to the ninth gate L1-9 of the first level L1. Similarly, the fifth gate L2-5 of the second level L2 is connected to the fourth, the fifth, the sixth, and the twelfth gates L1-4, L1-5, L1-6, and L1-12 while the sixth gate L2-6 of the second level L2 is connected to the seventh and the eight gates L1-7 and L1-8. The seventh and the eighth gates L2-7 and L2-8 are connected in common to the eighth gate L1-8 while the ninth and the tenth gates L2-9 and L2-10 are connected to the tenth and the eleventh gates L1-10 and L1-11, respectively.

Figure 2:
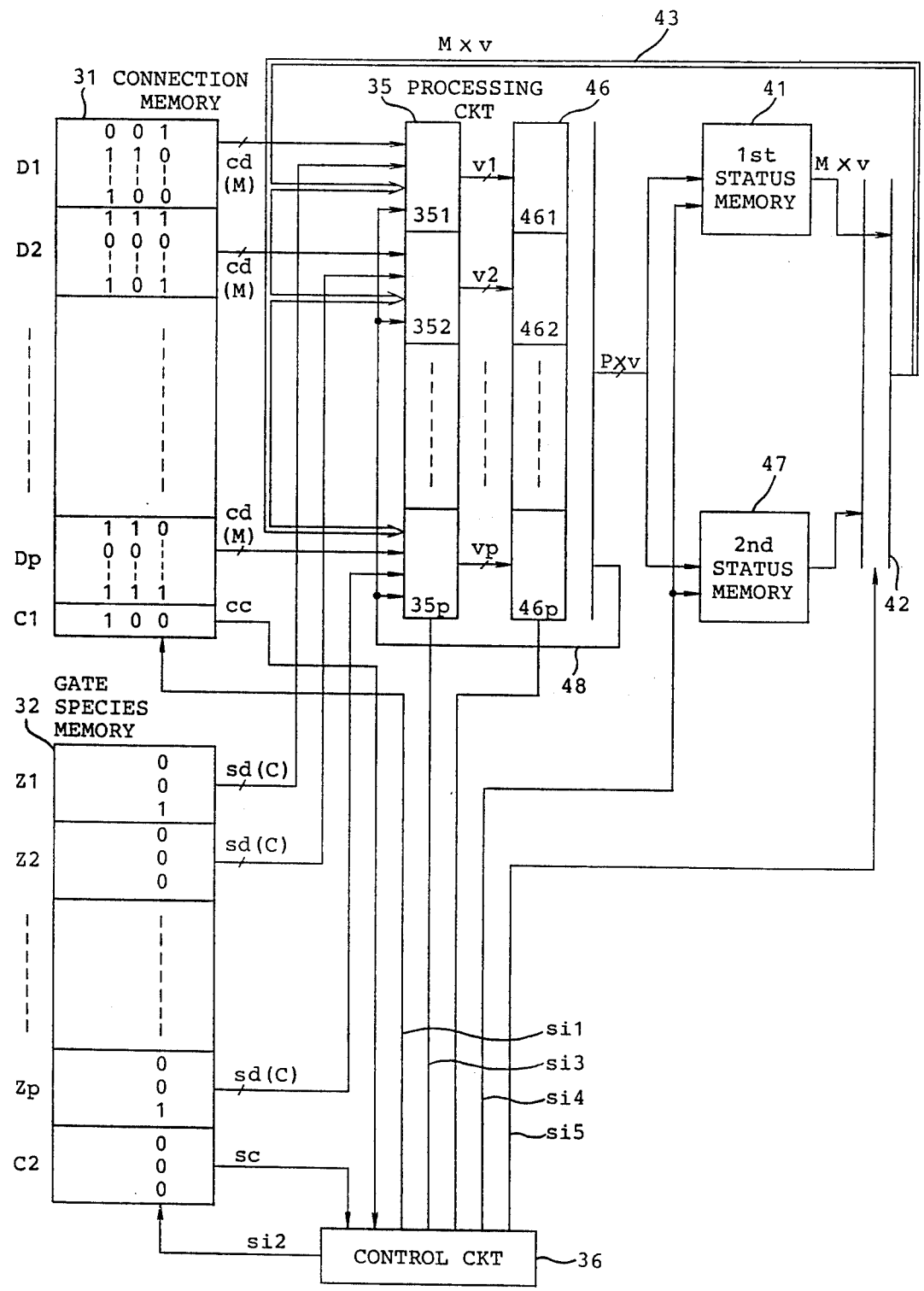
FIG. 2 is a block diagram of a hardware simulator according to a first embodiment of this invention.

Referring to FIG. 2, a hardware simulator according to a first embodiment of this invention is capable of simulating operations of the logic circuit illustrated in FIG. 1 in a manner to be described. To this end, the illustrated hardware simulator comprises a connection memory 31 for storing a plurality of connection data signals cd which specify connection of the gates.

More specifically, the connection memory 31 has first through p-th data areas indicated at D1 to Dp and a connection control area indicated at C1, where p is a natural number. In the example being illustrated, the number p is described as being greater than unity, although it may be unity. In this event, the number p is representative of the number of the gates which can be simulated in parallel and takes either one of 4, 8, 16, 32, and so on. Without loss of generality, the number p will be assumed to be equal to four hereinunder. As regards the logic circuit illustrated in FIG. 1, it may be said under such an assumption that the first data area D1 is loaded with the connection data signals cd for the first, the fifth, and the ninth gates L2-1, L2-5, and L2-9 of the level L2 illustrated in FIG. 1 while the second data area D2 is loaded with the connection data signals cd for the second, the sixth, and the tenth gates L2-2, L2-6, and L2-10 of the second level L2. Likewise, the third and the fourth data areas D3 and D4 are loaded with the connection data signals cd for the third and the seventh gates L2-3 and L2-7, and for the fourth and sixth gates L2-4 and L2-8, respectively. If eleventh and twelfth gates L2-11 and L2-12 are present, the connection data signals therefor are stored in the third and the fourth data areas D3 and D4, respectively.

The connection data signal cd for each gate of a predetermined one of the levels is representative of presence or absence of connections of the respective gates placed in a preceding one of the levels. For example, the connection data signals cd for each gate of the second level L2 (FIG. 1) define the connections between the first through twelfth gates L1-1 to L1-12 of the first level L1 and the first through tenth gates L2-1 to L2-10 of the second level L2. Each connection data signal is composed of a plurality of bits each of which takes a logic "1" level or a logic "0" level on the presence and absence of a connection, respectively.

The connection data signal for each gate of the second level L2 is therefore composed of twelve bits at most and is read out of each data area D1 to Dp at every set of a predetermined number M of bits. The predetermined number M may be equal to either one of 4, 8, 16, and so on and will be assumed to be equal to four. This shows that the connection data signal for each gate is divided into a plurality of sets each of which is read out of each data area D1 to Dp. Accordingly, access operations of the connection memory 31 must be monitored so as to detect whether or not a final set for each gate is read out of the connection memory 31. For this purpose, the connection control area C1 is loaded with a plurality of connection control signals cc for the respective sets of the connection data signals stored in the first through fourth data areas. The connection control signal cc takes the logic "1" level when it indicates the final set of the connection control signals cc and, otherwise, the connection control signal cc takes the logic "0" level.

Temporarily referring to FIG. 3, the connection data signals cd are exemplified about the first through tenth gates L2-1 to L2-10 of the second level L2 illustrated in FIG. 1, together with the connection control signals cc. As shown in FIG. 3, the first data area D1 is loaded with the connection data signals cd for the first, the fifth, and the ninth gates L2-1, L2-5, and L2-9 while the second data area D2 is loaded with the connection data signals cd for the second, the sixth, and the tenth gates L2-2, L2-6, and L2-10. Likewise, the third and the fourth data areas D3 and D4 are loaded with the connection data signals cd for the third and the seventh gates L2-3 and L2-7 and for the fourth and the eighth gates L2-4 and L2-8, respectively.

In the illustrated example, twelve bits of the connection data signals cd for each of the first through fourth gates L2-1 to L2-4 are made to correspond to the first through the twelfth gates L1-1 to L1-12 of the first level L1 from the rightmost column of FIG. 3 leftwards. From this fact, it is readily understood that the first gate L2-1 of the second level L2 is connected to the first, the third, and the ninth gates L1-1, L1-3, and L1-9 of the first level L1 while the second gate L2-2 of the second level L2 is connected to the second and the ninth gates L1-2 and L1-9 of the first level L1. At any rate, the twelve bits for the first through the fourth gates L2-1 to L2-4 of the second level L2 are representative of the connections between the first through the fourth gates L2-1 to L2-4 and the first through twelfth gates L1-1 to L1-12 of the first level L1, respectively.

The connection data signals cd are successively read out of the rightmost column in a bit parallel fashion. Each column is composed of sixteen bits which form a bit group read out in the bit parallel fashion and which are for L2-1 to L2-4.

The connection control signal cc stored in the connection control area C1 has a bit signal which is made to correspond to each bit group and which takes the logic "1" level when the bit group specifies the final sets of four bits. In other words, the bit signal of the logic "1" level is representative of completion or end of connections for the first through fourth gates L2-1 to L2-4 and may be named an input end signal or an input end flag. On the other hand, continuation of connections is indicated by the logic "0" level of the connection control signal cc. The resultant connection control signal cc is composed of three bit signals of "001" for the first through fourth gates L2-1 to L2-4.

This is also true of the connection data signals and the connection control signal cc for the fifth through eighth gates L2-5 to L2-8.

As regards the ninth and the tenth gates L2-9 and L2-10 of the second level L2, it is noted that no connections are made to the first through eighth gates L1-1 to L1-8 of the first level L1, as shown in FIG. 1. This shows that it is possible to neglect connections between the ninth and the tenth gates L2-9 and L2-10 of the second level L2 and the first through eighth gates L1-1 to L1-8 of the first level L1. However, only the connections between the ninth and the tenth gates L2-9 and L2-10 and the first through fourth gates L1-1 to L1-4 are neglected in FIG. 3 for convenience of description. In this connection, the connection control signal cc is composed of two bit signals of "01".

Referring to FIG. 2 again and Fig. 4 afresh, the illustrated hardware simulator comprises a gate species memory 32 which has first through p-th, namely, fourth zones Z1 to Zp (Z4) and a species control zone C2. Each of the first through p-th zones Z1 to Zp is loaded with gate species data signals sd while the species control zone C2 is loaded with species control signals sc.

As shown in FIG. 4, the first through the fourth zones Z1 to Z4 are assigned to the first, the fifth, and the ninth gates L2-1, L2-5, and L2-9; the second, the sixth, and the tenth gates L2-2, L2-6, and L2-10; the third and the seventh gates L2-3 and L2-7; and the fourth and the eighth gates L2-4 and L2-8, respectively. Each of the gate species data signals sd is composed of c bits arranged from the most significant bit to the least significant bit. In FIG. 4, the number c is equal to three. The two more significant bits of each gate species data signal sd are representative of a species of each gate. Specifically, the two more significant bits of "00", "01", and "10" represent an AND gate, an OR gate, and an EXOR gate, respectively. In addition, the least significant bit of each gate species data signal sd is representative of a polarity of an output and takes the logic "1" level and the logic "0" level when the polarity is positive and negative, respectively, namely, when the output is the true output and the compliment output, respectively.

Each of the species control signals sc is composed of the first or most significant bit, the second bit, and the third bit. The first bit of each species control signal sc represents whether or not a following set of four gates may be skipped or neglected in the connection memory 31. Such skipping or neglection is possible when no connection is present between the gate in question and a preceding set of gates. It is assumed that no connection is made between the fifth through eighth gates L2-5 to L2-8 of the second level L2 and the first through fourth gates L1-1 to L1-4 of the first level L1, although the connection is actually present between the fifth gate L2-5 of the second level L2 and the fourth gate L1-4 of the first level L1. Under the circumstances, connections may be neglected between the fifth through eighth gates L2-5 to L2-8 of the second level L2 and the first through fourth gates L1-1 to L1-4. When such neglection is possible, the first bit of each species control signal sc takes the logic "1" level. Otherwise, it takes the logic "0" level. Thus, the first bit of each species control signal serves to carry information concerning neglection. Although the first bit alone is used in the illustrated embodiment, plural bits are used to neglect or skip a plurality of gate sets.

The second bit of each species control signal sc is representative of completion or end of each simulation carried out in connection with each level and may be called a level end signal. The level end signal takes the logic "1" level when each simulation is completed in connection with each level. Regarding the third level L3, the level end signal becomes the logic "1" level when the simulation is carried out in relation to the tenth gate L2-10.

The third bit of each species control signal sc takes the logic "1" level on completion of an overall simulation of the logic circuit and may be referred to as a simulation end or completion signal. As regards the logic circuit illustrated in FIG. 1, the third bit becomes the logic "1" level when the third gate Lm-3 of the m-th level Lm is simulated.

In FIG. 2, the illustrated hardware simulator comprises an operation or processing circuit 35 coupled to the connection memory 31 and the gate species memory 32 and a control circuit 36 coupled to the connection memory 31, the gate species memory 32, and the processing circuit 35. At any rate, a combination of the processing circuit 35 and the control circuit 36 is operable to successively execute each of the simulations in a manner to be described and may be called a simulation executing unit.

More particularly, the processing circuit 35 is divided into first through p-th partial processing units 351 to 35p which are supplied with the connection data signals cd of M bits read out of the first through p-th data areas D1 to Dp, respectively. Moreover, the gate species data signals sd of three bits are delivered from the first through p-th Z1 to Zp of the gate species memory 32 to the first through p-th partial processing units 351 to 35p, respectively.

In order to start or initialize the simulation in question, test data signals for each of the simulations must be supplied to the first through p-th partial processing units 351 to 35p. To this end, the test data signals are memorized in a first status memory 41 and delivered through a selection circuit 42 and a bus 43 to the first through p-th partial processing units 351 to 35p, respectively.

On the other hand, the control circuit 36 is given the connection control signals cc and the species control signals sc read out of the connection control area c1 of the connection memory 31 and the species control zone c2 of the gate species memory 32, respectively. Thus, the control circuit 36 successively sends first, second, and third simulation control signals si1 to si3 to the connection memory 31, the gate species memory 32, and the processing circuit 35, respectively.

Under the circumstances, the first through p-th partial processing units 351 to 35p carry out the simulation of the first through p-th gates, such as the first through fourth gates L2-1 to L2-4, to produce first through p-th result signals v1 to vp representative of first through p-th results of the simulation, respectively. The first through p-th result signals v1 to vp may be called processed signals, respectively, and may be collectively referred to as simulation result signals. Each of the first through p-th result signals v1 to vp is specified by either a single bit or two bits. The single bit takes either "0" or "1" while the two bits can represent either one of "0,"

"1," an uncertain state or unknown state depicted as "X," nd an open state or high impedance state depicted as "Z." Each of the partial processing units will be described in detail later.

In any event, the first through p-th result signals v1 to vp are sent as the simulation result signal to a register member 47 divided into first through p-th register units 461 to 46p and are stored into the first through p-th register units 461 to 46p, respectively. The first through p-th result signals v1 to vp are delivered to either one of the first status memory 41 and a second status memory 47 and are also fed back as feedback signals FB to the respective partial processing units 351 to 35p through a feedback signal line 48. The feedback signal line 48 serves as a signal supply circuit for supplying the simulation result signal to the processing circuit 35 as an execution result signal.

The hardware simulator illustrated in FIG. 2 carries out the simulation of the logic circuit illustrated in FIG. 1 in a manner to be described below. Each of the simulations is successively progressive from the first level L1 towards the m-th level Lm at every one of the levels. At the outset, a first group of test data signals is stored in the first status memory 41 to be sent to the first through p-th partial processing units 351 to 35p. In FIG. 1, the first group of test data signals has a pattern of "110101100011" for the first through the twelfth input terminals 21-1 to 21-12. Inasmuch as the number p is equal to four in FIGS. 3 and 4, the simulation is carried out by the use of the first through fourth partial processing units 351 to 354 which are supplied with the connection data signals cd of four bits for the first through fourth gates L1-1 to L1-4 of the first level L1 and with the gate species data signals sd of three bits for the first through fourth gates L1-1 to L1-4.

Under the circumstances, the first through fourth result signals v1 to v4 are produced as the results of the simulation of the first through fourth gates L1-1 to L1-4 of the first level L1 and stored in the second status memory 47 through the register member 46.

The control circuit 36 monitors the simulation for the first through fourth gates L1-1 to L1-4 by successively watching the connection control signal cc and the species control signal sc read out of the connection control area c1 and the species control zone c2, respectively. Specifically, the simulation is continued as long as the connection control signal cc takes the logic "0" level. This shows that the simulation is not completed for all of the connections of the four gates with preceding gates. In this case, the simulation proceeds to following connections of the four gates with reference to the feedback signals FB given through the feedback signal line 48.

On the other hand, when the connection control signal cc takes the logic "1" level, the control circuit 36 makes the processing circuit 35 end the simulation for the four gates in question. The first through fourth result signals are stored into the second status memory 47 through the first through fourth register circuits 461 to 464.

Similar simulations are successively carried out until a final one of the gates that is placed in each level is simulated. In this event, the species control signal sc includes the level end signal of the logic "1" level. Regarding the second level L2 illustrated in FIG. 1, the level end signal becomes the logic "1" level when the simulation is carried out until the tenth gate L2-10, as shown in FIG. 4.

Subsequently, the simulation is succeeded by a following simulation for a following one of the levels. Similar operation is carried out until the gates of the last or m-th level are simulated in a like manner. Completion of the simulation is indicated by the simulation end signal included in the species control signal sc.

From this fact, it is readily understood that the illustrated hardware simulator has a simulation speed proportional to an amount of the connection data signals stored in the connection memory 31 because the simulation speed is determined by repetition times of the simulations. For example, the simulation of the second level L2 illustrated in FIG. 1 needs to access the connection memory 31 seven times, as shown in FIG. 3. That is, the connection memory 31 must be accessed three times on the simulation for the first through fourth gates L2-1 to L2-4, three times on the simulation for the fifth through eighth gates L2-5 to L2-8, and one time on the simulation for the ninth and the tenth gates L2-9 and L2-10.

It is possible to reduce repetitions of readout or access operation of the connection memory 31 by changing or modifying the connections of gates with preceding gates.

Figure 5:
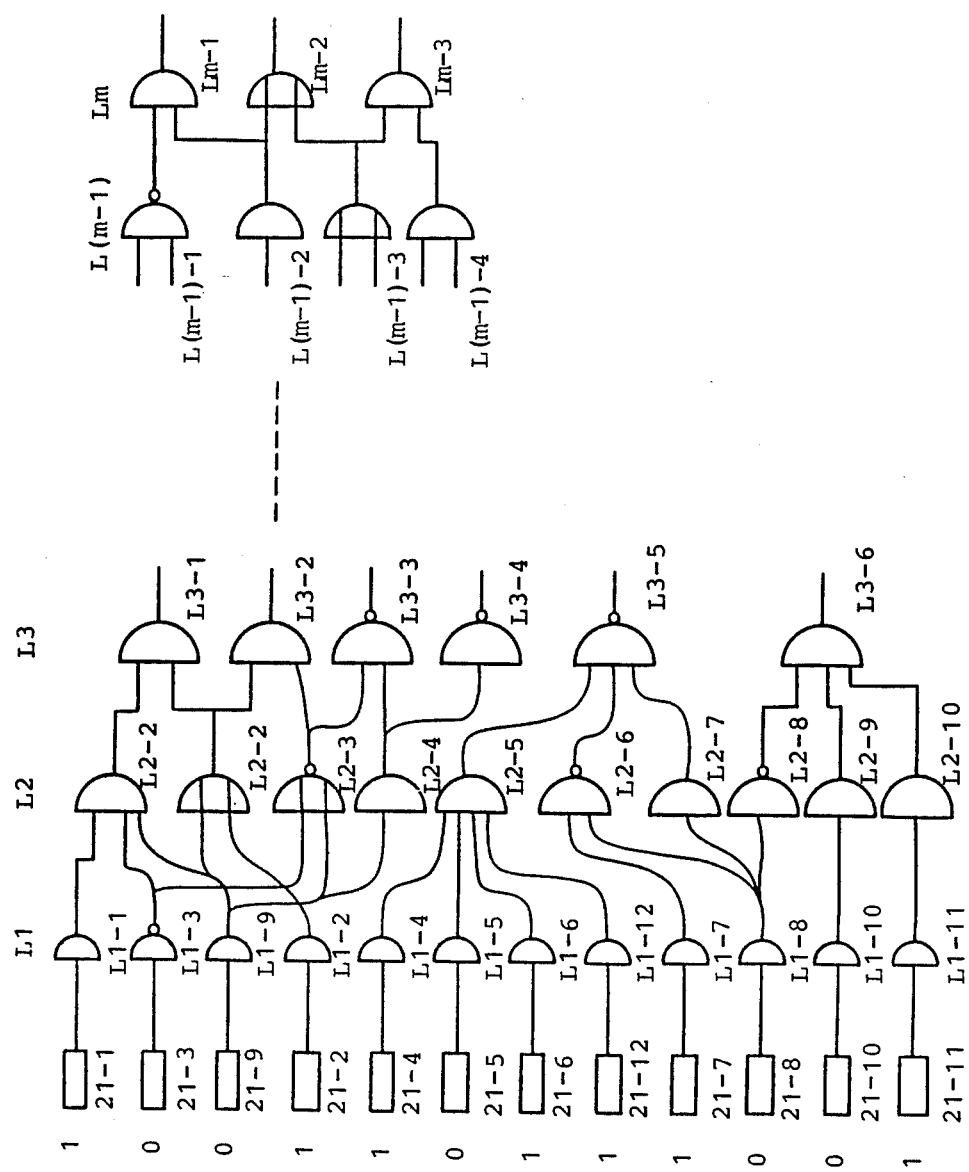
FIG. 5 is a circuit diagram of a modified logic circuit which is used for a hardware simulator according to a second embodiment of this invention and which is obtained by rearranging the logic circuit illustrated in FIG. 1.

Referring to FIG. 5, illustration is made of a modified logic circuit which is a modification of the logic circuit illustrated in FIG. 1. The modified logic circuit is obtained by applying fan-in tracing from the second level L2 shown in FIG. 1. In this connection, the first through twelfth gates L1-1 to L1-12 and the first through twelfth input terminals 21-1 to 21-12 are rearranged as shown in FIG. 5.

In FIG. 5, the first through twelfth gates L1-1 to L1-12 of the first level L1 are located in the order of the first, third, ninth, second, fourth, fifth, sixth, twelfth, seventh, eighth, tenth, and eleventh gates L1-1, L1-3, L1-9, L1-2, L1-4, L1-5, L1-6, L1-12, L1-7, L1-8, L1-10, and L1-11, respectively, with the order of the first through tenth gates L2-1 to L2-10 of the second level L2 kept unchanged.

Referring to FIG. 6, the connection memory 31 is loaded with connection data signals cd and connection control signal cc for the first through tenth gates L2-1 to L2-10 of the second level L2 shown in FIG. 5. In FIG. 6, bit positions of the connection data signals cd are made to correspond to the gates of the first level L1 illustrated in FIG. 6 and are successively numbered in the order from the uppermost or first gate L1-1 to the lowermost or eleventh gate L1-11, respectively. It is to be noted that the first through fourth gates L2-1 to L2-4 of the second level L2 is FIG. 5 are not connected to the gates except for the first, third, ninth, and second gates L1-1, L1-3, L1-9 and L1-2. Therefore, the connection data signals cd for the first through fourth gates L2-1 to L2-4 are very simple as illustrated in FIG. 6.

At any rate, the second level L2 of the modified logic circuit illustrated in FIG. 5 can be simulated by the use of four series of the connection data signals cc arranged in columns in FIG. 6. Therefore, the simulation for the first through tenth gates L2-1 to L2-10 of FIG. 5 is possible by accessing the connection memory 31 four times.

Referring to FIG. 7, the gate species memory 32 has first through fourth species zones Z1 to Z4 for storing gate species data signals sd obtained from the modified logic circuit shown in FIG. 5 and a species control zone c2 for storing species control signals sc.

At any rate, the modified logic circuit can be simulated by accessing the connection control memory 31 four times, as shown in FIG. 6. As a result, the simulation time is reduced to ⅓ relative to that of the logic circuit shown in FIG. 5 because an amount of the connection data signals cd can be reduced in the modified logic circuit.

Thus, the hardware simulator described with reference to FIG. 5 carries out an overall simulation of a logic circuit, namely, an original logic circuit by modifying the logic circuit into a modified logic circuit. Such a modification method will be generalized in the following manner in connection with a logic circuit which is divisible into a plurality of levels each of which comprises leading through trailing gates. Each of the gates has at least one fan-in and at least one fan-out.

At first, an optional one of the levels is selected as a reference level and a leading gate of the reference level is determined as a reference gate. In a next following level that follows the reference level, the gates are rearranged into rearranged gates a leading one of which is connected to an output of the reference gate. The remaining gates in the next following level are successively rearranged in consideration of a distance from each gate of the reference level.

Similar rearrangement is successively made about the remaining levels placed after the next following level. Thus, fan-out tracing is applied to the following levels after the reference level until reaching the output terminals.

In a preceding level which precedes the reference level, fan-in tracing is carried out at every fan-in the above-mentioned manner. More particularly, the gates in the preceding level are rearranged into rearranged gates a leading one of which is connected to an input of the reference gate and the remaining one of which are successively relocated in consideration of the rearranged leading gate of the preceding level. Thus, similar rearrangement is carried out back to the input terminals by successively tracing each fan-in. At any rate, such rearrangement is made so that connections become shortest between two adjacent ones of the levels. This procedure may be called shortening or dense set procedure. As a result, the logic circuit is restructured into a modified logic circuit by the dense set procedure, as shown in FIG. 5. The dense set procedure results in a reduction of connection data signals as mentioned before. Accordingly, simulations can be carried out at a high speed by the use of the reduced connection data signals.

Incidentally, the reference gate is an optional one selected from the gates of the reference level. In this event, similar results are also obtained by tracing each fan-in and fan-out. For example, it is assumed that the first gate L1-1 of the first level L1 is selected as the reference gate L1. In this situation, let fan-out tracing be carried out in regard to the first gate L1-1 of the first level L1. As a result, the first gate L2-1 of the second level L2 is located at a top position of the second level L2 of the modified logic circuit, as shown in FIG. 5. Likewise, fan-out tracing is carried out in regard to the first gate L2-1 of the second level L2 to locate the first gate L3-1 of the third level L3 at a top position of the third level L3 of the modified logic circuit, as shown in FIG. 5. Herein, it is to be noted that the first gate L2-1 of the second level L2 in FIG. 1 has the other inputs equal in number to two. Fan-in tracing is carried out in connection with each of the other inputs of the first gate L2-1 of the second level L2. As a result, the third gate L1-3 of the first level L1 is located at a second position of the first level L1 in the modified logic circuit and the ninth gate L1-9 of the first level L1 is located at a third position of the first level L1 in the modified logic circuit. The modified logic circuit is obtained by applying similar procedure to the remaining gates.

Figure 8:
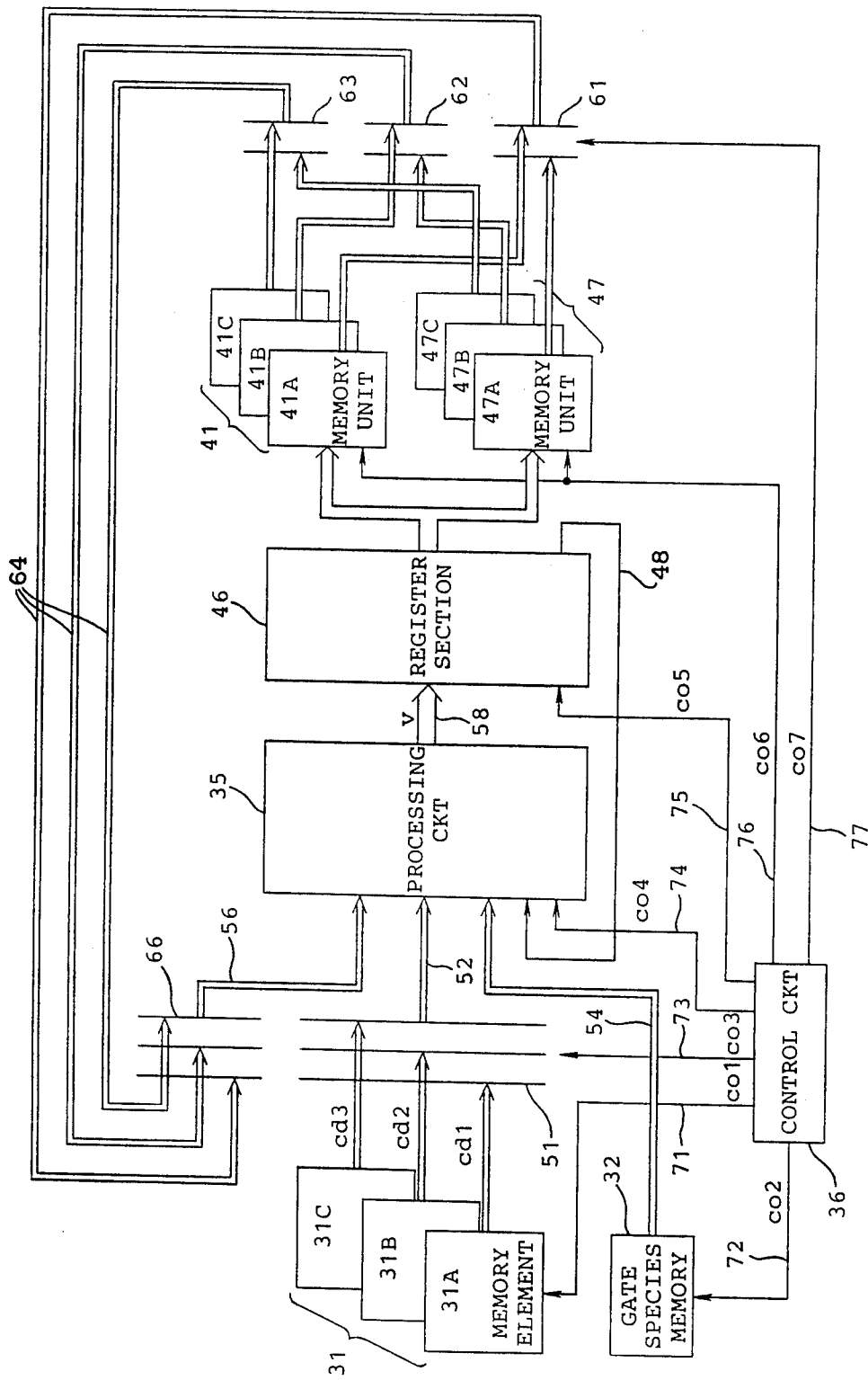
FIG. 8 is a block diagram of a hardware simulator according to a third embodiment of this invention.

Referring to FIG. 8, a hardware simulator according to a third embodiment of this invention comprises similar parts designated by the same reference numerals and symbols. The illustrated hardware simulator successively carries out simulations in a pipeline fashion as will become clear. For this purpose, the connection memory 31 comprises first through third memory elements depicted at 31A, 31B, and 31C and a memory selector 51 controlled by the control circuit 36. In the example being illustrated, each connection data signal cd for each gate is divided into first through third partial connection data cd1 to cd3 signals which are individually stored in the first through third memory elements 31A to 31C, respectively. Each of the first through third partial connection data signals cd1 to cd3 is composed of eight bits and is read out of each memory element 31A to 31C in bit parallel form. However, no consideration need be made of the connection control signals cc in FIG. 8. Each of the first through third partial connection data signals cd1 to cd3 is selectively sent through the memory selector 51 and a connection data line group 52 to the processing circuit 35.

The processing unit 35 is supplied with the gate species data signal sd of c bits from the gate species memory 32 through a species data line group 54. Like in FIGS. 4 and 7, the gate species data signal sd may be composed of three bits two of which is representative of a gate species, such as an AND gate, an OR gate, an EXOR gate, and the remaining one of which is representative of a polarity of each gate. The two bits for the gate species can be the first and the second bits while the remaining bit for the polarity can be the third bit.

The processing circuit 35 is also selectively supplied with the test data signals in a pipeline fashion through a test data line group 56 and with the feedback signal FB through a feedback line 48 from the register member 46. The processing circuit 35 carries out a simulation to supply the register member 46 with a result signal v through a result signal line 58.

Such a simulation is carried out by the use of either one of the first through third partial connection data signals cd1 to cd3 and may therefore be named a partial simulation. In the illustrated example, a simulation for a single gate is divided into first through third portions of the partial simulations. The register member 46 is coupled to the first and the second status memories 41 and 47. The first and the second status memories 41 nd 47 comprise first through third memory units 41A, 41B, and 41C, and 47A, 47B, and 47C, respectively. In the illustrated example, the memory units 41A and 47A are connected to a first selection unit 61 while the memory units 41B and 47B are connected to a second selection unit 62. In addition, the memory units 41C and 47C are connected to a third selection unit 63. The first through third selection units 61 to 63 deliver first, second, and third selected signals through a signal line group 64 to a selection circuit 66. The selection circuit 66 selected either one of the first through third selected signals that is supplied as the test data signals to the processing circuit 35.

In order to carry out the simulation for each gate in the pipeline fashion, the control circuit 36 delivers first through seventh control signals CO1 to CO7 to the connection memory 31, and the gate species memory 32, both the memory selector 51 and the selection circuit 66, the processing circuit 35, the register member 46, both the first and the second status memories 41 and 47, and the first through third selection units 61 to 63, respectively. The first through seventh control signals CO1 to CO7 are given through first through seventh control lines 71 to 77, respectively, as shown in FIG. 8.

Figure 9:
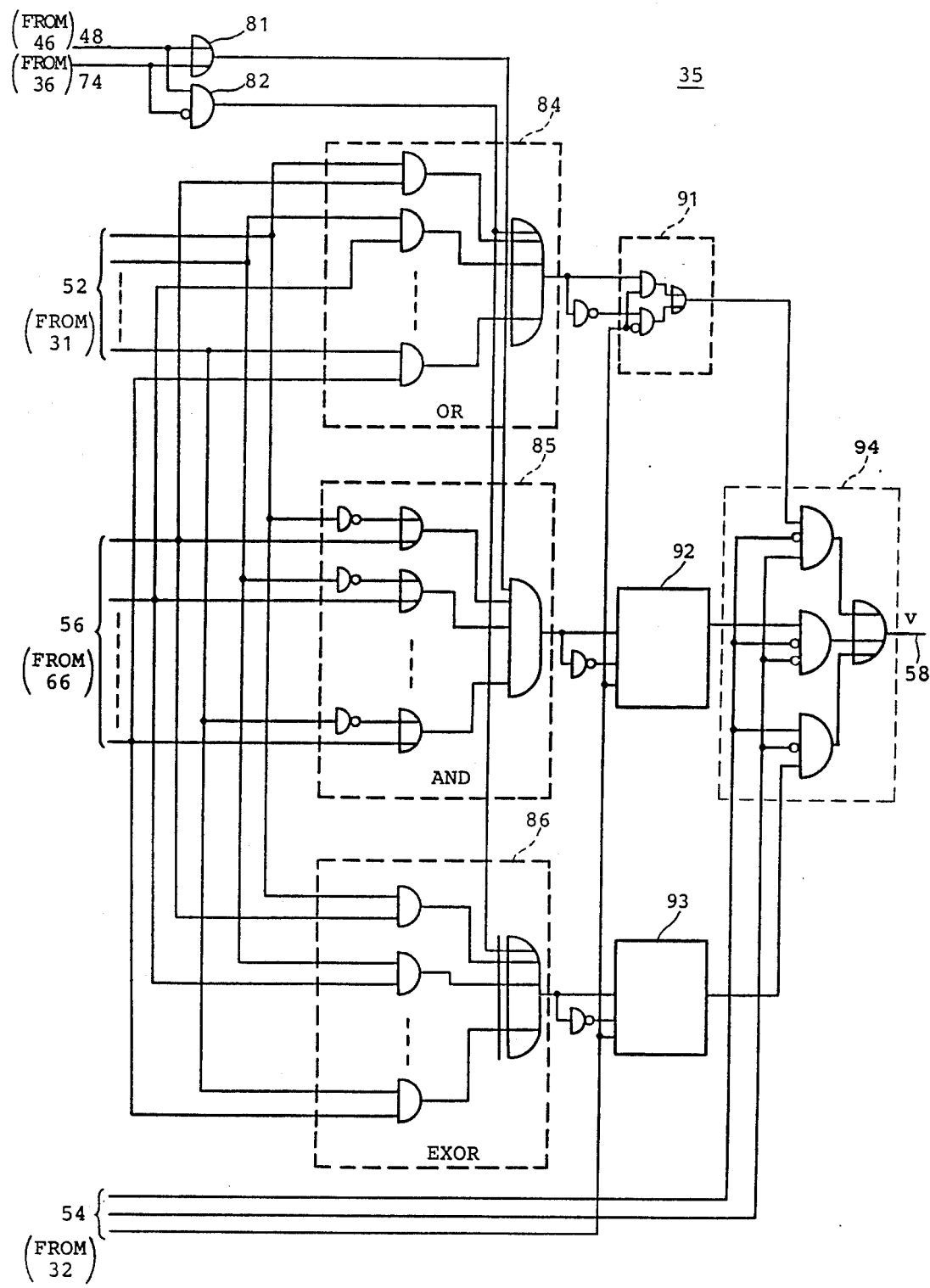
FIG. 9 is a block diagram of a processing circuit used in the hardware simulator illustrated in FIG. 8.

Referring to FIG. 9, a simulation unit for use in the processing unit 35 is operable to carry out the simulation of each gate. For brevity of description, it is assumed that the simulation is carried out in connection with a single gate and is divided into a first through third partial simulations which are successively carried out at every level of gates in response to binary signals with no delay accompanied in each gate. Such binary signals may be connection data signals, test data signals, gate species data signals, and the like, as described in connection with FIGS. 3 and 4. Each of the connection data signals and the test data signals is assumed to be eight bits. For convenience of description, each connection data signal for each partial simulation will be called a partial connection data signal hereinunder.

At an initial state, the logic "0" level is given from the register member 46 as the feedback signal (FB) through the feedback signal line 48 while the logic "1" level is given as the fourth control signal CO4 from the control circuit 36 through the fourth control line 74. Thus, the initial state is determined by the logic "0" level of the feedback signal FB and the logic "1" level of the fourth control signal CO4.

The feedback signal FB and the fourth control signal CO4 are given to first and second input gates 81 and 82 so as to control an OR calculation circuit 84, an AND calculation circuit 85, and an EXOR calculation circuit 86. The OR, the AND, and the EXOR calculation circuits 84, 85, and 86 may be collectively named a logical operation circuit because they carry out different logical operations, respectively. In the illustrated example, the first input gate 81 is connected to the AND calculation circuit 85 while the second input gate 82 is connected to the OR and the EXOR calculation circuits 84 and 86.

Each of the OR calculation circuit 84, the AND calculation circuit 85, and the EXOR calculation circuit 86 is supplied with each partial connection data signal (cd) of eight bits and the test data signal of eight bits through the connection data line group 52 and the test data line group 56, respectively. This shows that the illustrated simulation unit can simulate each single gate which may be connected to eight preceding gates because eight bits of each partial connection data signal are supplied to the simulation unit.

The OR calculation circuit 84, the AND calculation circuit 85, and the EXOR calculation circuit 86 are connected to first, second and third output control gates 91, 92, and 93, respectively, which are similar in structure to one another. Each of the first through third output control gates 91 to 93 is supplied with the third bit of the species data signal sd to specify the polarity of each gate. In this case, the third bit of the species data signal sd takes the logic "1" level when an output signal of each gate to be simulated is true. When the output signal is complementary (not true), the third bit takes the logic "0" level.

In any event, the first through third output control gates 91 to 93 produce first through third output signals in dependency upon the third bit of the species data signal sd. The first through third output signals are delivered to an output gate 94 which is supplied with the first and the second bits of the species data signal sd and which comprises three input gate units and an output on gate unit. Inasmuch as the first and the second bits take "00," "01," and "10" when an AND gate, an OR gate, and an EXOR gate are simulated, respectively, the result signal v is produced as a result of each partial simulation through either one of the three input gate units and the output OR gate in response to the gate species data signal formed by the first and the second bits of the species data signal sd. Thus, a combination of the first through third output control gates 91 and 93 nd the output gate 94 serves to select one of operation results sent from the calculation circuits 84 to 86 and may therefore be referred to as a selection circuit.

Figure 10:
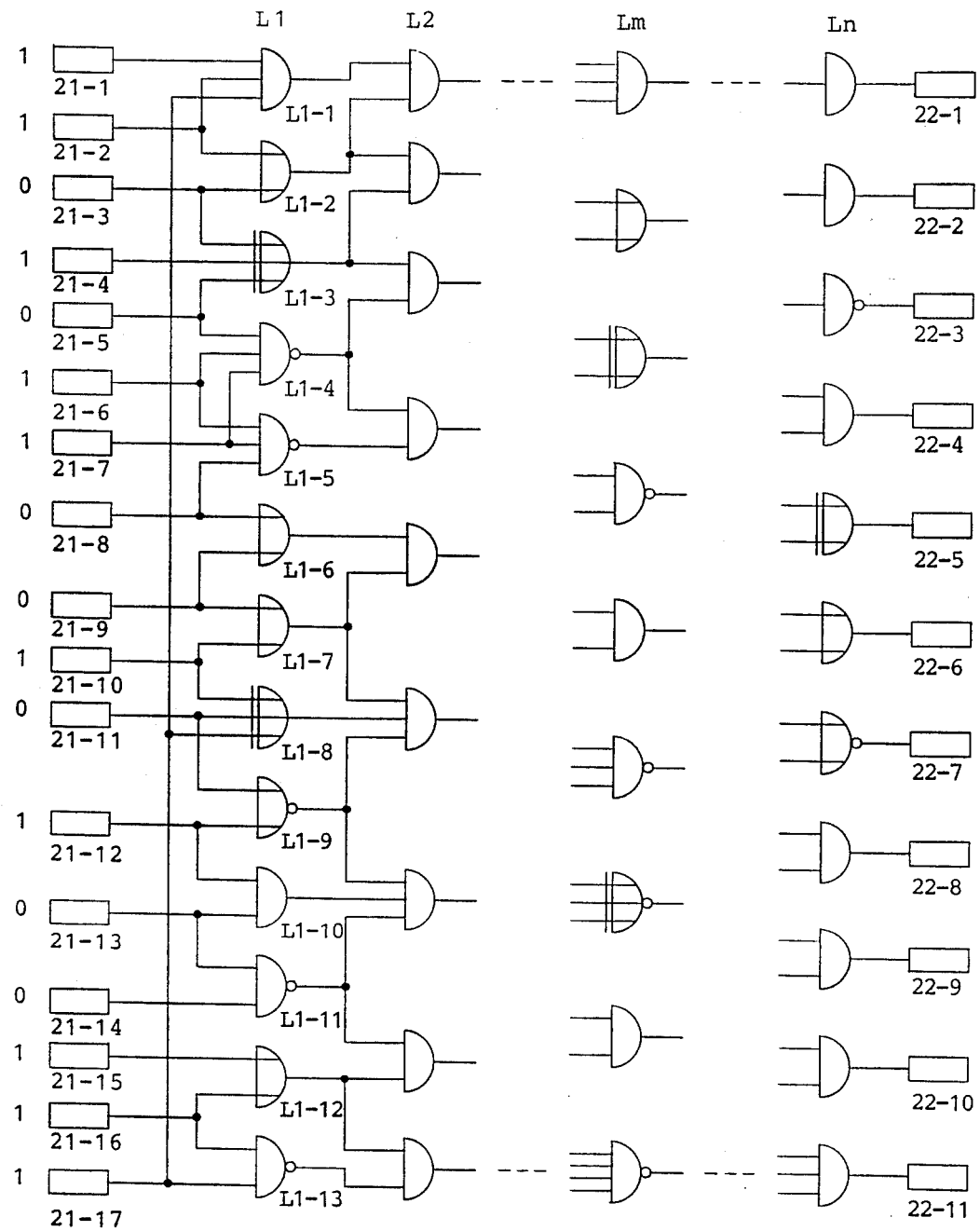
FIG. 10 exemplifies another logic circuit that can be simulated by the hardware simulator illustrated in FIG. 8.

Referring to FIG. 10 together with FIGS. 8 and 9, let a logic circuit illustrated in FIG. 10 be simulated by the use of the hardware simulator illustrated in FIGS. 8 and 9. The logic circuit illustrated in FIG. 10 has first through seventeenth input terminals 21-1 to 21-17 nd first through eleventh output terminals 22-1 to 22-11 and comprises a great number of gates which are connected between the input and the output terminals and which are divided into first through n-th levels L1 to Ln including an m-th level Lm between the second and the n-th levels L2 and Ln.

For simplicity of description, it is surmised that a simulation is carried out in regard to first through thirteenth gates L1-1 to L1-13 of the first level L1 which are connected to the first through seventeenth input terminals 21-1 to 21-17.

At first, the test data signal is read out of the memory unit 41A and has a pattern of "11010110" which are given to the first through eighth input terminals 21-1 to 21-8 illustrated in FIG. 10, respectively. The first memory element 31A of the connection memory 31 produces the partial connection data signal cd1 which specifies connections of either one of the first through eighth gates L1-1 to L1-8 of FIG. 10 with the first through eighth input terminals 21-1 to 21-8. The connection between the first gate L1-1 and the first through eighth input terminals 21-1 to 21-8 is given by the partial connection data signal cd of "11000000." In addition, the gate species memory 32 supplies the processing circuit 35 with the gate species data signal of "000."

Thus, the memory selector 51 selects the partial connection data signal cd1 of the memory element 31A while the first selections unit 61 and the selection circuit 66 selects the test data signal read out of the memory unit 41A of the first status memory 41.

Responsive to the above-mentioned test data signal, partial connection data signal cd1, and gate species data signal sd, the processing circuit 35 carries out the first partial simulation of the first gate L1-1 which is illustrated in FIG. 10 and which is connected to the first, second, and seventeenth input terminals 21-1, 21-2, and 21-17. The first partial simulation is carried out by the use of the simulation unit illustrated in FIG. 9. In this event, the feedback signal FB and the fourth signal CO4 takes the logic "0" and "1" levels, respectively, as mentioned before, and appear on the feedback signal line 48 and the fourth interval control line 74, respectively. The relationship among the above-mentioned signals is shown in Table 1.

As shown in Table 1, the result signal v of the logic "1" level is supplied through the output gate 94 (FIG. 9)

of the processing circuit 35 to the register member 46. The result signal v is kept in the register member 46 on one hand and fed back through the feedback signal line 48 as the feedback signal FB on the other hand.

TABLE 1

|  | v(58) |  |
|---|---|---|
| Line 48 | 0 | 1 |
| Line 74 | 1 |  |
| Line Group 52 | 1 |  |
|  | 1 |  |
|  | 0 |  |
|  | 0 |  |
|  | 0 |  |
|  | 0 |  |
|  | 0 |  |
|  | 0 |  |
| Line Group 56 | 1 |  |
|  | 1 |  |
|  | 0 |  |
|  | 1 |  |
|  | 0 |  |
|  | 1 |  |
|  | 1 |  |
|  | 0 |  |
| Line Group 54 | 0 |  |
|  | 0 |  |
|  | 0 |  |

Subsequently, the fourth control signal CO4 is rendered into the logic "0" level and is sent to the processing circuit 35 through the fourth interval control line 74. Thus, the second partial simulation is started so as to simulate the first gate L1-1 again.

Under the circumstances, the second partial connection data signal cd is read out of the second memory element 31B of the connection memory 31 and is sent through the memory selector 51 to the processing circuit 35. The second connection data signal cd2 in question defines the connection between the first gate L1-1 (FIG. 10) and the ninth through sixteenth input terminals 21-9 to 21-16. Inasmuch as no connection is made between the first gate L1-1 and the ninth through sixteenth input terminals 21-9 to 21-16, the connection data signal cd of eight bits is given by "00000000." On the other hand, a test data signal is read out of the memory unit 41-B to be sent through the second selection unit 62 and the selection circuit 66 to the processing unit 35. The test data signal under consideration may have a pattern of "01010011" which is given to the ninth through sixteenth input terminals 21-9 to 21-16, respectively. The second partial simulation is carried out in the processing unit 35 in the above-mentioned manner with the gate species data signal sd of "000" kept unchanged. In this case, the processing circuit 35 supplies the register member 46 with the result signal v of the logic "1" level as a result of the second partial simulation.

The result signal v of the logic "1" level is returned back to the processing circuit 35 as the feedback signal FB through the feedback signal line 48. On the other hand, the fourth control signal CO4 is kept at the logic "0" level after the initial state.

The third partial simulation is carried out by the use of the third partial connection data signal cd3 which defines a connection between the first gate L1-1 and the seventeenth input terminal 21-17. As a result, the third partial connection data signal cd3 is specified by a pattern of "10000000." The third partial connection data signal cd3 is read out of the third memory element 31c of the connection memory 31 to be sent to the processing circuit 35 through the memory selector 51.

A third one of the test data signals is also read out of the memory unit 41c of the first status memory 41 to be delivered through the third selection unit 63 and the selection circuit 66 to the processing circuit 35. The third test data signal may have a pattern of "10000000." This processing circuit 35 carries out the third partial simulation in relation to the first gate L1-1 with the gate species data signal sd kept at "000." The result signal v of the logic "1" level is produced as a result of the third partial simulation from the processing circuit 35 and is kept in the register member 46.

The above-mentioned procedure is shown in Table 2 wherein the first through third partial simulations are abbreviated to SM1 to SM3, respectively.

TABLE 2

|  | SM1 | v | SM2 | v | SM3 | v |
|---|---|---|---|---|---|---|
| Line 48 | 0 | 1 | 1 | 1 | 1 | 1 |
| Line 47 | 1 |  | 0 |  | 0 |  |
| Line | 1 |  | 0 |  | 1 |  |
| Group 52 | 1 |  | 0 |  | 0 |  |
|  | 0 |  | 0 |  | 0 |  |
|  | 0 |  | 0 |  | 0 |  |
|  | 0 |  | 0 |  | 0 |  |
|  | 0 |  | 0 |  | 0 |  |
|  | 0 |  | 0 |  | 0 |  |
| Line Group 56 | 1 |  | 0 |  | 1 |  |
|  | 1 |  | 1 |  | 0 |  |
|  | 0 |  | 0 |  | 0 |  |
|  | 1 |  | 1 |  | 0 |  |
|  | 0 |  | 0 |  | 0 |  |
|  | 1 |  | 0 |  | 0 |  |
|  | 1 |  | 1 |  | 0 |  |
|  | 0 |  | 1 |  | 0 |  |
| Line Group 54 | 0 |  | 0 |  |  |  |
|  | 0 |  | 0 |  |  |  |
|  | 0 |  | 0 |  |  |  |

Figure 11:
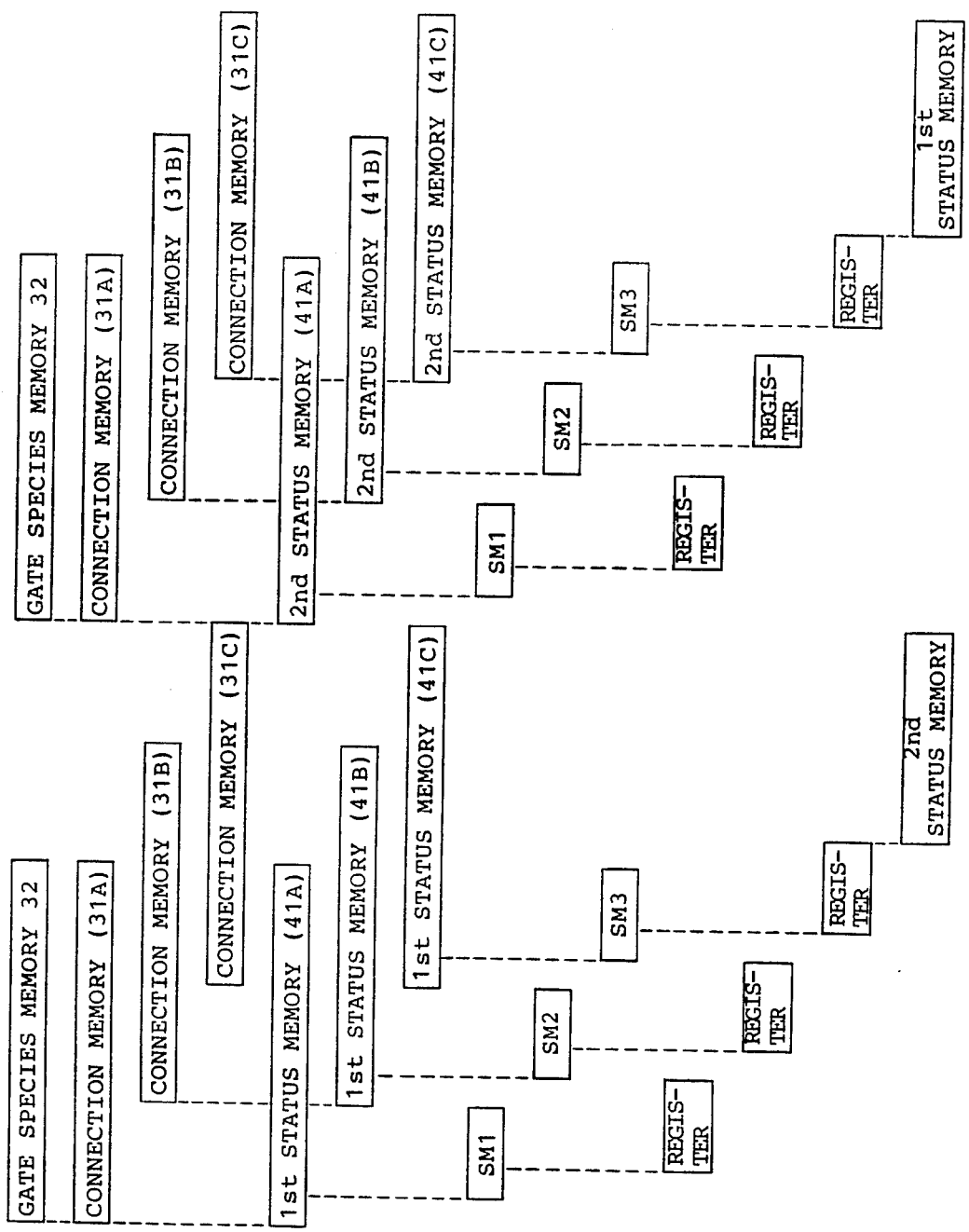
FIG. 11 is a time chart for use in describing operations of the hardware simulator illustrated in FIG. 8.

Referring to FIG. 11, the first partial simulation SM1 is carried out by the use of the gate species memory 32, the first memory element 31A of the connection memory 31, and the first memory unit 41A of the first status memory 41. When the result signal is produced as a result of the first partial simulation SM1 and stored in the register member 46, the second partial simulation SM2 is carried out by the use of the second memory element 31B of the connection memory 31 and the second memory unit 41B of the first status memory 41. Thus, the second partial simulation SM2 is started while the first memory element 31A of the connection memory 31 and the first memory unit 41A of the first status memory 41 are loaded with the first partial connection data signal cd1 and the test data signal, respectively, in relation to the former first partial simulation SM1.

When a result of the second partial simulation SM2 is stored in the register member 46 as the result signal v, the third partial simulation SM3 is carried out by the use of the third memory element 31c of the connection memory 31 and the third memory unit 41c of the first status memory 41. A result of the third partial simulation SM3 is kept in the register member 46 as the result signal and is moved to the second status memory 47.

As shown in FIG. 11, the connection memory 31 and the first status memory 41 are used in an overlapped manner during the first through third partial simulations SM1, SM2, and SM3. Therefore, the simulations for the first gate L1-1 can be quickly carried out in the pipeline fashion.

After the first through third partial simulations SM1, SM2, and SM3 for the first gate L1-1 are completed in the hardware simulator illustrated in FIG. 8, a first partial simulation SM1 for the second gate L1-2 is carried out in a like manner by the use of the gate species memory 32, the memory element 31A, and the memory unit 47A of the second status memory 47. After a result of the first partial simulation is kept in the register member 46, a second partial simulation SM2 for the second gate L1-2 is started and carried ut by the use of the second memory element 31B, the second memory unit 47B of the second status memory 47, and the gate species memory 32. A result of the second partial simulation SM2 is moved to the register member 46. Subsequently, a third partial simulation SM3 is carried out in cooperation with the gate species memory 32, the third memory element 31C of the connection memory 31, and the third memory unit 47C of the second status memory 47. A result of the third partial simulation SM3 is kept in the register member 46 and is moved to the first status memory 41.

As mentioned above, the first and the second status memories 41 and 47 are alternatively used in the illustrated hardware simulator each time gates to be simulated are changed from one to another. In addition, the memory elements of the connection memory 31 and the memory units of each of the first and the second status memories 41 and 47 are successively selected in simulating each of the gates. This makes it possible to carry out the simulations of each gate in the pipeline fashion.

In the example being illustrated, the description has been made on the assumption that a single gate alone is simulated during the first through third partial simulations SM1, SM2, and SM3 for brevity of description. However, a plurality of gates are actually simulated in parallel in the above-mentioned pipeline fashion. In this event, the partial connection data signals (cd) and the species data signals sd for the plurality of gates are read out of each memory element 31A to 31C and the gate species memory 32 in a manner similar to that illustrated in FIG. 2.

While this invention has thus far been described in conjunction with a few embodiments thereof, it will readily be possible for those skilled in the art to put this invention into practice in various other manners. For example, the partial connection data signals cd memorized in each memory elements 31A to 31C (FIG. 8) may be derived from a modified logic circuit as illustrated in FIG. 5. In addition, the processing unit illustrated in FIG. 9 is also applicable to the hardware simulator illustrated in FIG. 2. Also, the number of the memory elements and the memory units is not restricted to three.

What is claimed is:

1. A hardware simulator for use in successively carrying out simulations of a plurality of gates included in a logic circuit, said simulator comprising:

connection memory means for storing a plurality of connection data signals which specify connections of said gates and for producing a predetermined number of said connection data signals one at a time;

gate species memory means for storing a plurality of gate species data signals representative of species of said gates and for producing a predetermined number of said gate species data signals one at a time;

first memory means for storing a plurality of test data signals utilized for simulation of said gates and for successively producing each of said test data signals;

simulation execution means, coupled to said connection memory means, said gate species memory means, and said first memory means and responsive to an execution result signal, for executing said simulations of said gates in response to said predetermined number of said connection data signals, and each of said plurality of test data signals with reference to said execution result signal to successively produce a simulation result signal representative of a result of each of said simulations;

holding means for holding said simulation result signal;

supply means for supplying said simulation result signal held in said holding means to said simulation execution means as said execution result signal;

second memory means, coupled to said holding means, for successively storing said simulation result signal and for producing a stored result signal; and signal delivering means, coupled to said first and said second memory means and to said simulation execution means, for selectively delivering one of said each test data signal and said stored result signal to said simulation execution means.

2. A hardware simulator as claimed in claim 1, wherein said simulation execution means comprises:

processing means, coupled to said connection memory means, said gate species memory means, said first memory means, and said supply means, for processing said execution result signal, said predetermined number of said connection data signals, said predetermined number of said gate species data signals, and each of said plurality of test data signals to successively execute each of said simulations and to successively produce said simulation result signal; and control means for controlling said connection memory means, said gate species memory means, said first and second memory means, said supply means, and said processing means to enable said processing means to execute each of said simulations in cooperation with said connection memory means, said gate species memory means, said first and second memory means, and said supply means.

3. A hardware simulator as claimed in claim 2, wherein said processing means comprises:

processing unit means, equal in number to said predetermined number, for individually processing each of said gate species data signals and each of said connection data signals with reference to each of said test data signals and said execution result signal and for producing a processed signal representative of a result of processing; and means for producing said processed signal as said simulation result signal.

4. A hardware simulator as claimed in claim 3, wherein said processing unit means comprises:

logical operation means, responsive to each of said test data signals, each of said connection data signals, and said execution result signal, for carrying out a plurality of logical operations in parallel and for producing operation result signals representative of results of said logical operations; and means, coupled to said logical operation means and responsive to each of said gate species data signals, for producing a selected one of said operation result signals determined by each of said gate species data signals and for producing said selected one of said operation result signals as said processed signal.

5. A hardware simulator as claimed in claim 1, said logic circuit being divisible into a plurality of levels which are successively connected to one another and each logic level comprising at least one gate, wherein one of said simulations is carried out at each of said levels.

6. A hardware simulator as claimed in claim 1, each of said simulations being divisible into a plurality of partial simulations, each of said connection data signals being divisible into a plurality of partial connection data signals necessary for respective partial simulations, wherein said connection memory means comprises:

a plurality of memory elements for storing said partial connection data signals;

selection means coupled to said memory elements for successively selecting said partial connection data signals one by one to successively produce each of said partial connection data signals; and means for producing said partial connection data signals as said connection data signals.

7. A hardware simulator as claimed in claim 6, wherein said simulation execution means successively carries out said partial simulations to produce as said simulation result signal a sequence of partial result signals representative of results of said partial simulations.

8. A simulation method of successively carrying out simulations of a plurality of gates included in a logic circuit, said gates having a predetermined arrangement which is divisible into a plurality of levels successively connected from a first level to a last level, said simulation method comprising the steps of:

selecting one of said levels as a reference level;

modifying said predetermined arrangement with reference to said reference level into a modified arrangement by rearranging said gates of said logic circuit;

deriving, from said modified arrangement, connection data signals representative of connections of said gates in said modified arrangement; and successively executing each of said simulations by the use of said connection data signals.

* * * * *

UNITED STATES PATENT AND TRADEMARK OFFICE
CERTIFICATE OF CORRECTION

PATENT NO. : 4,945,503
DATED : July 31, 1990
INVENTOR(S) : Shigeru TAKASAKI

It is certified that error appears in the above—identified patent and that said Letters Patent is hereby corrected as shown below:

In the Abstract, lines 8-9, "references" should read --reference--.

Column 3, line 9, "M" should read "m".

Column 3, line 19, "L-19" should read --L1-9--.

Column 3, line 20, "L2-2" should read --L2-4--.

Column 7, line 7, "47" should read --46--.

Column 8, line 50, "is" should read --in--.

Column 8, line 57, delete "the".

Column 10, line 33, before "an" (third occurrence) insert --or--.

Column 10, line 62, "selected" should read --selects--.

Column 11, line 1, delete "and".

UNITED STATES PATENT AND TRADEMARK OFFICE
CERTIFICATE OF CORRECTION

PATENT NO. : 4,945,503

DATED : July 31, 1990

INVENTOR(S) : Shigeru Takasaki

It is certified that error appears in the above-identified patent and that said Letters Patent is hereby corrected as shown below:

```
Column 11, line 13, "a" (second occurrence) should read
        --the--.
Column 12, line 14, "nd" should read --and--.
Column 12, line 22, "nd" should read --and--.
Column 12, line 62, "takes" should read --take--.
Column 15, line 10, "ut" should read --out--.
```

Signed and Sealed this

Seventh Day of July, 1992

Attest:

DOUGLAS B. COMER

*Attesting Officer*　　　*Acting Commissioner of Patents and Trademarks*